United States Patent
Igawa et al.

(10) Patent No.: US 8,941,901 B2
(45) Date of Patent: Jan. 27, 2015

(54) ELECTROPHOTOGRAPHIC IMAGE OUTPUT DEVICE

(71) Applicants: Hiroyuki Igawa, Kanagawa (JP); Hideki Kamaji, Kanagawa (JP)

(72) Inventors: Hiroyuki Igawa, Kanagawa (JP); Hideki Kamaji, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/138,312

(22) Filed: Dec. 23, 2013

(65) Prior Publication Data
US 2014/0211266 A1  Jul. 31, 2014

(30) Foreign Application Priority Data
Jan. 28, 2013 (JP) .................. 2013-012994

(51) Int. Cl.
*H04N 1/46* (2006.01)
*H04N 1/405* (2006.01)
*G06K 15/02* (2006.01)
*G03F 5/22* (2006.01)
*H04N 1/52* (2006.01)

(52) U.S. Cl.
CPC ........ *H04N 1/40018* (2013.01); *G06K 15/1881* (2013.01); *G03F 5/22* (2013.01); *H04N 1/4058* (2013.01); *H04N 1/52* (2013.01)
USPC .......... 358/533; 358/3.06; 358/3.13; 358/3.2; 358/3.26; 358/534; 358/535; 358/536

(58) Field of Classification Search
USPC .................. 358/1.9, 3.06–3.2, 3.26, 533–536
See application file for complete search history.

(56) References Cited

U.S. PATENT DOCUMENTS

| | | | | |
|---|---|---|---|---|
| 4,537,470 | A  * | 8/1985 | Schoppmeyer | 359/891 |
| 5,258,850 | A  * | 11/1993 | Tai | 358/3.15 |
| 5,953,988 | A  * | 9/1999 | Vinck | 101/129 |
| 7,508,549 | B2 * | 3/2009 | Tai et al. | 358/3.2 |
| 7,839,537 | B2 * | 11/2010 | Tai et al. | 358/3.2 |
| 2002/0089708 | A1* | 7/2002 | Cheng et al. | 358/534 |
| 2004/0021883 | A1* | 2/2004 | Sugizaki | 358/1.9 |
| 2006/0023258 | A1* | 2/2006 | Loce et al. | 358/3.2 |
| 2007/0019976 | A1 | 1/2007 | Watanabe et al. | |
| 2007/0103730 | A1 | 5/2007 | Yasutomi | |
| 2012/0120454 | A1 | 5/2012 | Igawa | |
| 2013/0108326 | A1 | 5/2013 | Igawa | |

FOREIGN PATENT DOCUMENTS

| | | |
|---|---|---|
| JP | 10-171252 | 6/1998 |
| JP | 2007-156394 | 6/2007 |

* cited by examiner

*Primary Examiner* — Richard Zhu
(74) *Attorney, Agent, or Firm* — Oblon, Spivak, McClelland, Maier & Neustadt, L.L.P.

(57) ABSTRACT

An electrophotographic image output device includes an image processor to receive input image data, and a line screen to represent halftone images and have multiple screen angles respectively allocated to different colors including yellow, magenta, and cyan. The line screen satisfies requirements of (A) a predetermined difference is secured between adjacent two of the multiple screen angles; (B) zero is not allocated to any of the multiple screen angles; and (C) among the multiple screen angles determined by the requirements (A) and (B), a screen angle closest to 90 degrees is allocated to yellow among yellow, magenta, and cyan.

4 Claims, 8 Drawing Sheets

ELECTROPHOTOGRAPHIC IMAGE OUTPUT DEVICE

CROSS-REFERENCE TO RELATED APPLICATION

This patent application is based on and claims priority pursuant to 35 U.S.C. §119 to Japanese Patent Application No. 2013-012994, filed on Jan. 28, 2013, in the Japan Patent Office, the entire disclosure of which is hereby incorporated by reference herein.

BACKGROUND OF THE INVENTION

1. Technical Field

The present invention generally relates to an electrophotographic image output device such as an image forming apparatus that is a copier, a printer, a facsimile machine, a plotter, or a multifunction peripheral (MFP) having at least two of coping, printing, facsimile transmission, plotting, and scanning capabilities.

2. Description of the Background Art

In electrophotographic image formation, generally color stability is lower compared with offset printing, and it is preferred to enhance color stability. One of features of electrophotography is image processing, which includes parallel line processing (e.g., line screen or parallel line pattern). The number and the screen angle (i.e., inclination) of lines, by which characteristics of line screen are defined, are determined for each color considering factors such as moire, jaggy, banding, and the like that degrade image quality.

In conventional line screens, the screen angle of zero (0) degree or close to it is often allocated to yellow, which is less recognizable even when image quality is degraded. However, in the case of yellow parallel lines whose screen angle is adjacent to zero, toner images tend to be disturbed due to scavenging (described later) or the like. Further, it is possible that color fluctuations increase in the secondary colors of yellow, namely, red and green, in addition to yellow.

For example, JP-2007-156394-A proposes allocating the number (line per inch or lpi) and the screen angle of the respective color lines as follows using parallel line dithering in all of yellow, cyan, magenta, and black to improve moire with combination of dithering matrix different from conventional combinations: yellow: 200.0 lpi and 0.0 degrees, cyan: 180.3 lpi and 146.3 degrees, magenta: 180.3 lpi and 33.7 degrees, and black: 200.0 lpi and 90.0 degrees. This approach is to improve image quality, with the occurrence of moire and banding effects reduced, by optimizing the respective color line screen angles.

SUMMARY OF THE INVENTION

In view of the foregoing, one embodiment of the present invention provides an electrophotographic image output device that includes an image processor to receive input image data, and a line screen to represent halftone images and have multiple screen angles respectively allocated to different colors including yellow, magenta, and cyan. The line screen satisfies requirements of: (A) a predetermined difference is secured between adjacent two of the multiple screen angles; (B) zero is not allocated to any of the multiple screen angles; and (C) among the multiple screen angles determined by the requirements (A) and (B), a screen angle closest to 90 degrees is allocated to yellow among yellow, magenta, and cyan.

In another embodiment, in an electrophotographic image output device including an image processor and a line screen to represent halftone images and have multiple screen angles respectively allocated to different colors, a screen angle closest to 90 degrees among the multiple screen angles is allocated to yellow among yellow, magenta, and cyan.

BRIEF DESCRIPTION OF THE SEVERAL VIEWS OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

It is to be noted that, in the descriptions below, yellow, cyan, magenta, and black are also simply referred to as "Y", "C", "M", and "K".

The embodiment described below provides an electrophotographic image output device having a line screen capable of inhibiting color fluctuations in respective colors by determining screen angles of the respective colors to reduce adverse effects caused by scavenging in addition to adverse effects caused by banding and moire.

Initially, descriptions are given below of banding, moire, and scavenging, which are image quality degrading factors and to be considered in designing line screens.

[Banding]

Among density unevenness in a sub-scanning direction caused by fluctuations in the drive velocity of a photoreceptor drum, vibrations of a writing device, long-period density unevenness with a period of about 0.5 mm to 1.0 mm is called "banding". Since such a period corresponds to spatial frequency that is directly perceivable, banding can degrade image quality significantly. Additionally, when the screen angle is 0 degree, banding is more perceivable. It is to be noted that a screen angle at 90 degrees with a sheet conveyance direction is defined as 0 degree. In practice, however, there are many machine types in which yellow line screen angle is 0 degree or close to it since banding is less perceivable in yellow than in magenta, cyan, and black.

[Moire]

The term "moire" means visual striping that appears due to deviations in the cycle when regular cyclic patterns are superimposed multiple times. Similarly to banding, moire is perceived easily and can degrade image quality significantly. It is known that moire is likely to occur when the respective color line screen angles are close to each other, and the possibility of occurrence is lower in the combination of yellow and cyan and the combination of yellow and magenta, whereas the possibility of occurrence is higher in the combination of yellow and black.

[Scavenging]

In electrophotography or electrophotographic image formation, two-component magnetic brush type development is widely used to develop latent images with developer. In this development type, two-component developer including magnetic carrier and nonmagnetic toner is magnetically carried on a developing sleeve inside which a stationary magnet is provided, and developer is transported to a development range between the photoreceptor drum and the developing sleeve by rotation of the developing sleeve, thereby developing an electrostatic latent image formed on the photoreceptor drum.

Among two-component magnetic brush type developing devices, there are multistage developing devices that includes two developing sleeves (i.e., upstream and downstream developing sleeves) arranged in the direction of rotation of the photoreceptor drum. Multistage developing devices perform a first developing process using the upstream developing sleeve and a second developing process using the downstream developing sleeve, thereby repeatedly developing an identical electrostatic latent image on the photoreceptor drum. This is aimed at improving developability and preventing white voids at trailing ends of images or the like.

In the above-described development method, however, when the toner image developed by the upstream developing sleeve is again developed by the downstream developing sleeve, carrier (i.e., carrier particles) can electrostatically or mechanically scrape off toner from portions such as halftone image portions in which the amount of toner adhering is smaller and disturb the image, which is a phenomenon called scavenging. Additionally, scavenging force excessively acts on transverse lines perpendicular to the direction in which the carrier scrubs or scrapes the toner image in image development. Thus, scavenging tends to make the lines discontinuous.

Therefore, to inhibit degradation in image quality caused by banding and scavenging and the occurrence of moire, it is preferred to determine the respective color line screen angles to satisfy the following requirements:

(1) To avoid banding, the respective color line screen angles are not 0 degree or 90 degrees;

(2) To inhibit color fluctuations caused by scavenging, the screen angle is not adjacent to 0 degree; and (3) To avoid the occurrence of moire, the respective color line screen angles are not similar angles. That is, for example, an angle of about 30 degrees is kept between adjacent two of the respective line screen angles. In particular, yellow and black line screen angles demand care since the possibility of the occurrence of moire increases when theses are close to each other.

First Embodiment

Referring now to the drawings, wherein like reference numerals designate identical or corresponding parts throughout the several views thereof, an embodiment of the present invention is described.

The present embodiment concerns line screens in which screen angles are designed to inhibit degradation in image quality caused by banding and scavenging and the occurrence of moire and satisfies the above-described requirements (1), (2), and (3). These features are described in further detail below referring to drawings.

Figure 10A:
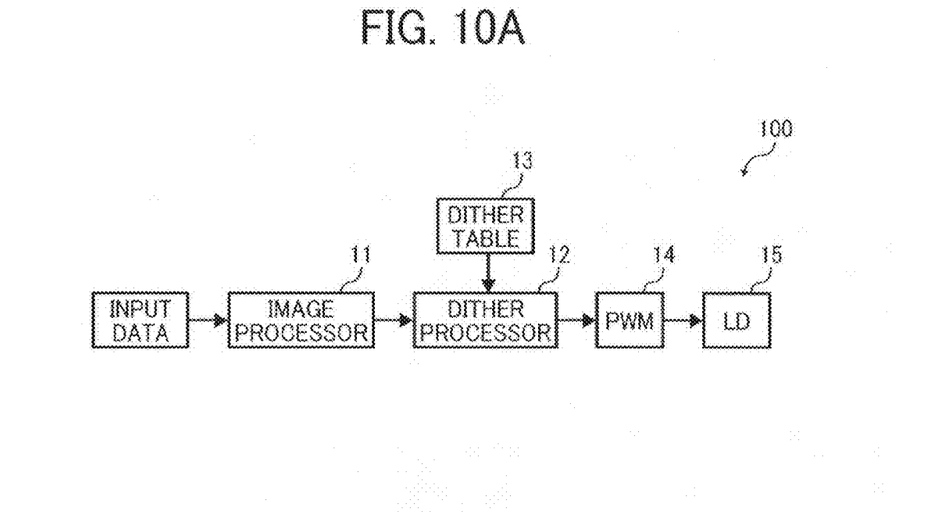
FIG. 10A is a block diagram illustrating a configuration of an electrophotographic image forming apparatus according to an embodiment.

FIG. 10A is a block diagram illustrating a configuration of an electrophotographic image forming apparatus 100 serving as an electrophotographic image output device according to the present embodiment.

Figure 10B:
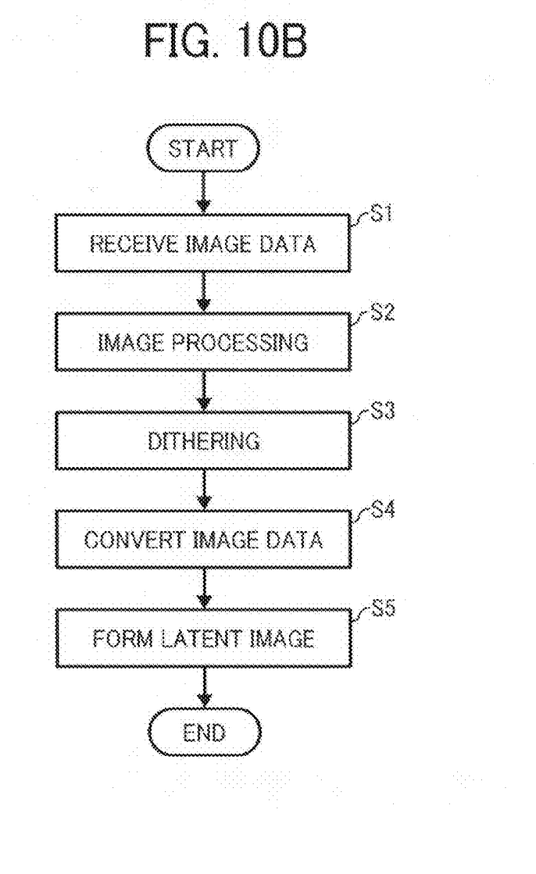
FIG. 10B is a flowchart illustrating steps of processing of image data according to an embodiment.

Operation of the image forming apparatus 100 is described with reference to FIGS. 10A and 10B.

The image forming apparatus 100 according to the present embodiment processes input images using a dither table, thereby generating image data to be output. The image forming apparatus 100 shown in FIG. 10A includes an image processor 11, a dither processor 12, a dither table 13, a pulse width modulation (PWM) unit 14, and a laser 15 such as a laser diode (LD). The following steps of processing shown in FIG. 10B are performed to form a latent image.

At S1, input image data is received by the image processor 11. At S2, the image processor 11 performs image processing. At S3, referring to a dither pattern stored in the dither table 13, the dither processor 12 performs dithering. Thus, the image data becomes dither-processed data. At S4, the dither-processed data is converted. At S5, the laser 15 forms a latent image on the surface of a photoreceptor drum 16 (shown in FIG. 3) according to the converted data.

It is to be noted that, although laser printers typically use pulse width modulation to convert image data at S4, other types of image data conversion or modulation can be used.

Further, to output the image, the latent image on the photoreceptor drum 16 is developed with toner into a toner image, and the toner image is transferred via an intermediate transfer member (such as an intermediate transfer belt ITB shown in FIG. 3) onto a recording mediums such as a paper sheet. Alternatively, the toner image may be directly transferred onto the recording medium. Then, the toner image is fixed on the recording medium. Since these processes are commonly known, detailed descriptions are omitted here.

The number and the screen angle of line screen can be combined in various ways. Accordingly, it is difficult to verify all of the various combinations. Therefore, effects of the present embodiment are described below referring to line screens in which a screen angle of 0 degree, which is unstable, is allocated to yellow.

Figure 1:
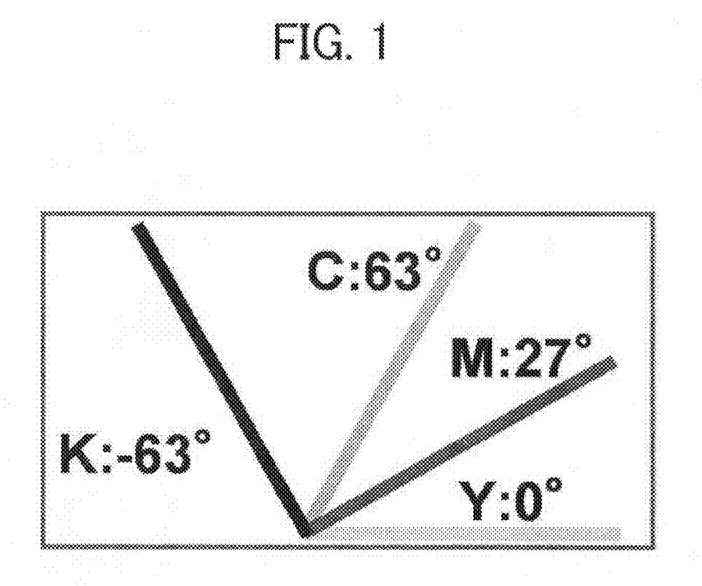
FIG. 1 illustrates a 600 dots per inch (dpi) and 2 bit default screen as a line screen model.
Figure 2:
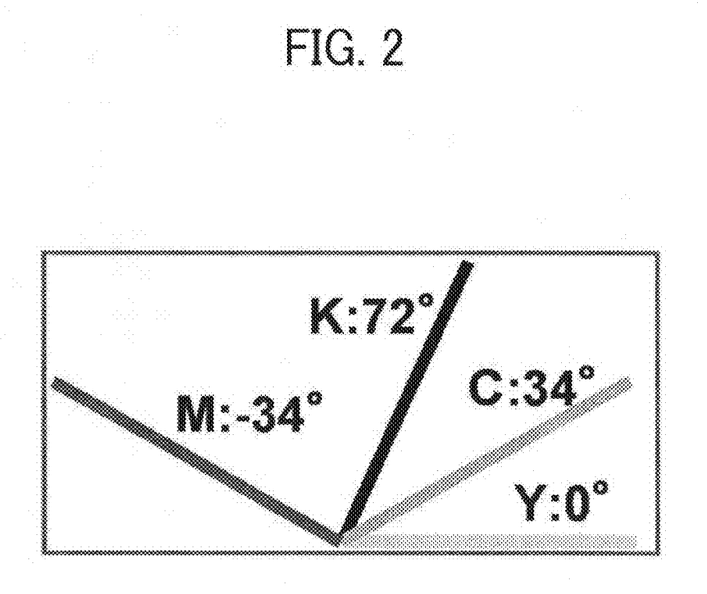
FIG. 2 illustrates a 600 dpi and 4 bit default screen as another line screen model.

The following two types of line screens are used as models or default screens. FIG. 1 illustrates a default screen of an output mode of 600 dots per inch (dpi) and 2 bits, and FIG. 2 illustrates a default screen of an output mode of 600 dpi and 4 bits. These default screens have the following screen line numbers and the screen angles for respective colors.

[600 dpi and 2 bit default screen shown in FIG. 1]

Y: 0 degree, M: 27 degrees, C: 63 degrees, and K: −63 degrees

[600 dpi and 4 bit default screen shown in FIG. 2]

Y: 0 degree, M: −34 degrees, C: 34 degrees, and K: −72 degrees

Descriptions are now given of factors to cause color fluctuations examined in a four-color tandem electrophotographic image forming apparatus that employs an intermediate transfer belt.

Figure 3:
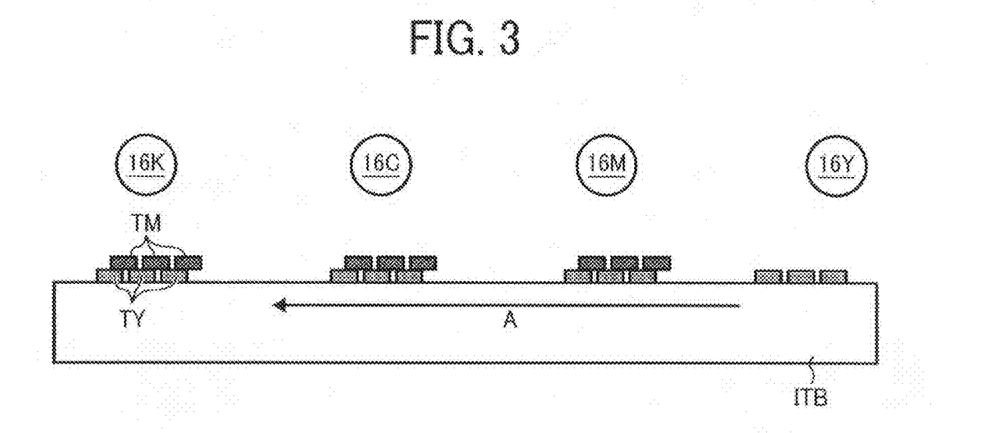
FIG. 3 illustrates disturbance of toner images caused by reverse transfer at primary transfer.

The inventors of the present invention recognize that images are degraded as follows in the transfer process from the photoreceptor drum 16 onto the intermediate transfer belt ITB.

(Primary-Transfer Process)

FIG. 3 illustrates disturbance of toner images caused by reverse transfer at primary transfer. In. FIG. 3, arrow A indicates the direction in which the intermediate transfer belt ITB transports toner images formed on its outer circumferential surface (hereinafter "belt travel direction A").

After the toner image is transferred from the photoreceptor drum 16 onto the intermediate transfer belt ITB, a part of toner (given reference "TY" and "TM" in FIG. 3) on the intermediate transfer belt ITB can reversely adheres to the photoreceptor drum 16 of a downstream image forming station in the belt travel direction A when the toner image passes through a contact portion (i.e., a transfer nip) between the intermediate transfer belt ITB and the photoreceptor drum 16. This is a phenomenon called "reverse transfer".

In the case of yellow toner TY, which is extreme upstream among the four colors, reverse transfer occurs third times, and in the case of magenta toner TM, reverse transfer occurs twice. Therefore, the toner image formed in the extreme upstream image forming station in the belt travel direction A is disturbed greatest number of times among four colors due to reverse transfer.

The inventors of the present invention recognize that, in the case of yellow, fluctuations in the toner adhering area are greater and fluctuations in the amount of toner adhering are greater. This means that the color of electrophotographic screen changes depending on the amount of toner adhering, and color fluctuations can be greater on the upstream side in the belt travel direction A.

(Secondary-Transfer Process)

Figure 4:
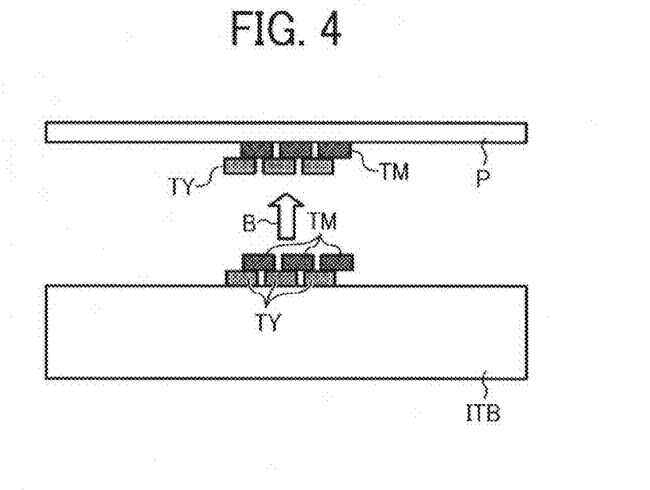
FIG. 4 illustrates disturbance of toner images caused by untransferred toner at secondary transfer.

FIG. 4 illustrates disturbance of toner images caused by untransferred toner at secondary transfer. In FIG. 4, arrow B indicates the direction in which the toner image is transferred from the intermediate transfer belt ITB onto a sheet P at secondary transfer.

As it is commonly known, when two or more different color toners are superimposed on the intermediate transfer belt ITB to create a combination color, the upstream toner, which is transferred onto the intermediate transfer belt ITB before another color is transferred, tends to partly remain on the intermediate transfer belt ITB and result in color fluctuations. For example, the colors remaining on the intermediate transfer belt ITB in creation of secondary colors by superimposing two colors are:

Yellow in the case of red created by superimposing yellow and magenta,

Yellow in the case of green created by superimposing yellow and cyan, and

Magenta in the case of blue created by superimposing magenta and cyan.

Typically, yellow is extreme upstream among the four colors in tandem electrophotography (i.e., four-color tandem electrophotographic image formation). Therefore, compared with other colors, color fluctuations are most likely to occur in yellow, which is on the extreme upstream side, due to reverse transfer at primary transfer and toner remaining on the intermediate transfer belt ITB at secondary transfer. Therefore, to reduce color fluctuations in four-color tandem electrophotography, it is preferred to suppress color fluctuations in yellow, which is the extreme upstream color, and red and green, which are secondary colors of yellow.

A line screen capable of suppressing color fluctuations can be created when this requirement is satisfied in addition to the requirements (1), (2), and (3) to be considered in determining the respective color line screen angles to inhibit degradation in image quality caused by banding and scavenging and the occurrence of moire. Then, the requirements according to the present embodiments are as follows.

(1) To avoid banding, a screen angle of 0 degree or 90 degrees is not allocated to the respective colors.

(2) To inhibit color fluctuations caused by scavenging, the screen angle is not adjacent to 0 degree.

(3) To avoid the occurrence of moire, the respective color line screen angles are not similar angles. In particular, yellow and black line screen angles demand care since the possibility of the occurrence of moire increases when theses are close.

(4) The screen angle adjacent to 90 degrees can stabilize the amount of toner adhering. Therefore, among the respective screen angles determined in view of the above (1) to (3), the screen angle adjacent to 90 degrees is allocated to the extreme upstream color among the respective colors in the order in which the respective colors are superimposed one on another to suppress color fluctuations in the extreme upstream color (and the secondary colors thereof). For example, when yellow is extreme upstream among the respective colors, a screen angle adjacent to 90 degrees is allocated to yellow to suppress color fluctuations in yellow, red, or green, or all of them.

Color stability is verified in 2 bit screens and 4 bit screens, respectively, having the screen angles below as examples of line screens satisfying the above-described four requirements.

[2 Bit Custom Screen]

Figure 5:
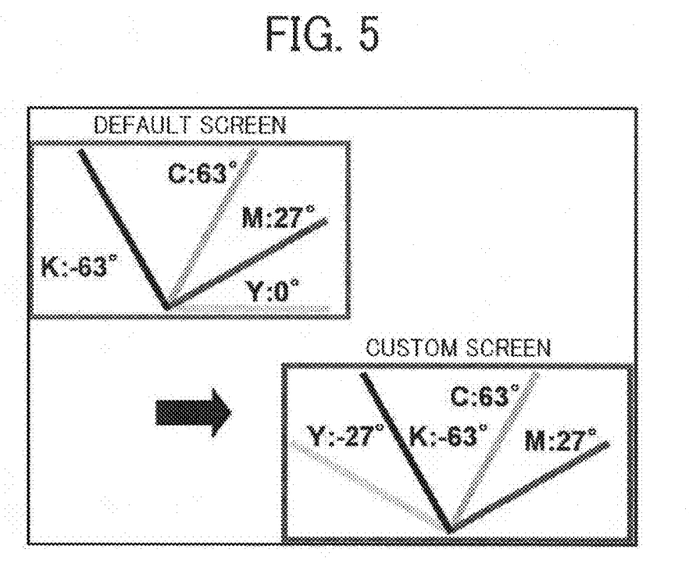
FIG. 5 illustrates a 600 dpi and 2 bit custom screen modified from the 600 dpi and 2 bit default screen.

FIG. 5 illustrates a proposed 2 bit custom screen modified from the 600 dpi and 2 bit default screen.

Yellow: −27 degrees (changed from 0 degree),

Magenta: 27 degrees,

Cyan: 63 degrees, and

Black: −63 degrees

The yellow line screen angle is preferably close to 90 degrees. However, moire may occur between yellow and black if the yellow line screen angle is close to 90 degrees because the black line screen angle is −63 degrees. Therefore, yellow is given the screen angle of −27 degrees, which can be advantageously generated by inverting 27 degrees allocated to magenta.

[4 Bit Custom Screen]

Figure 6:
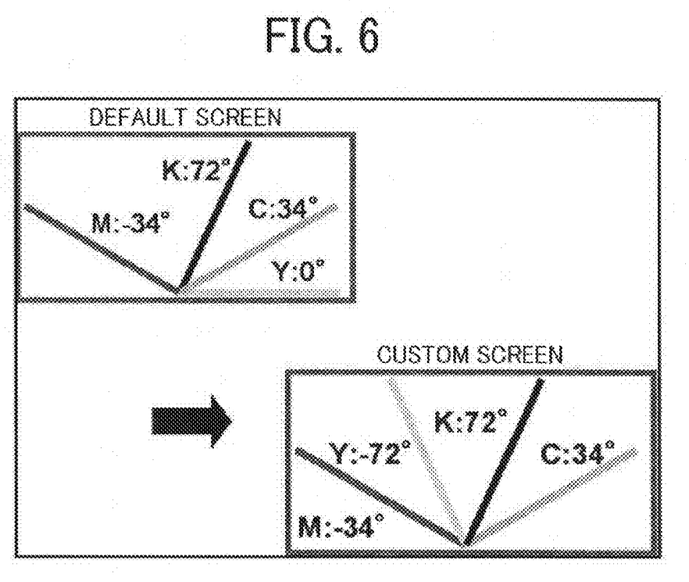
FIG. 6 illustrates a 600 dpi and 4 bit custom screen modified from the 600 dpi and 4 bit default screen.

FIG. 6 illustrates a proposed a 4 bit custom screen modified from the 600 dpi and 4 bit default screen.

Yellow: −72 degrees (changed from 0 degree),

Magenta: −34 degrees,

Cyan: 34 degrees, and

Black: 72 degrees

Since the black line screen angle is 72 degrees, a screen angle close to 90 degrees can be allocated to yellow.

Therefore, yellow is given the screen angle of −72 degrees, which can be advantageously generated by inverting the magenta screen angle.

Figure 7A:
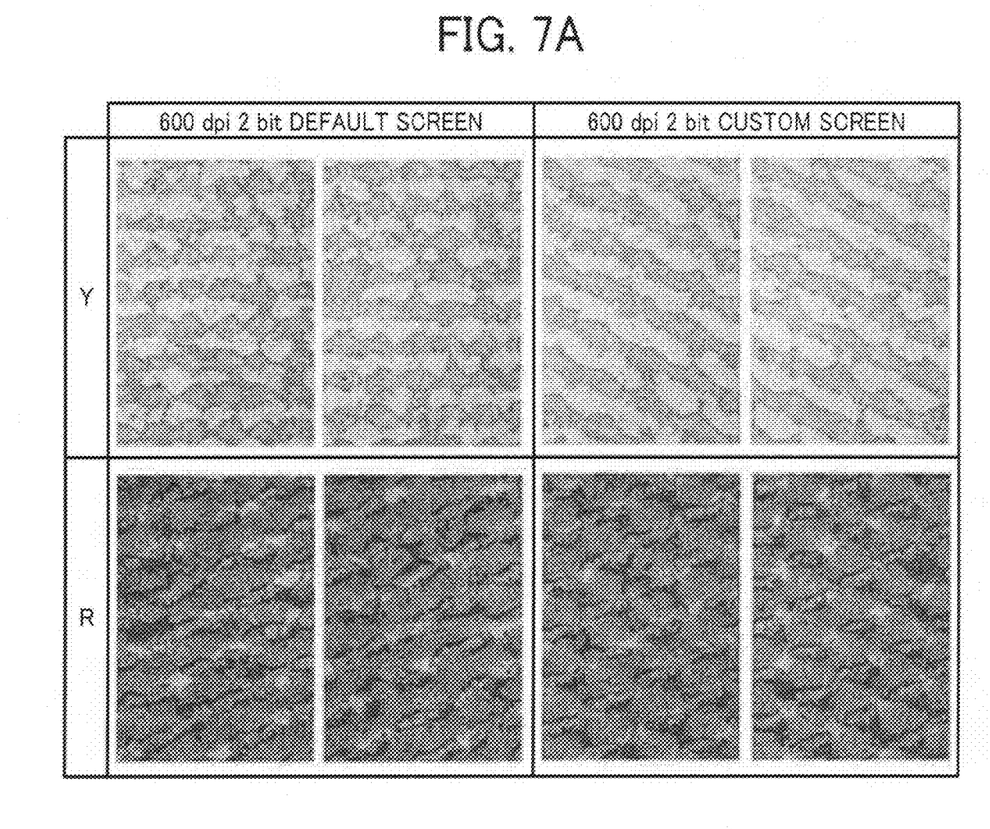
FIG. 7A illustrates toner images on the 600 dpi and 2 bit default screen and the 600 dpi and 2 bit custom screen.
Figure 7B:
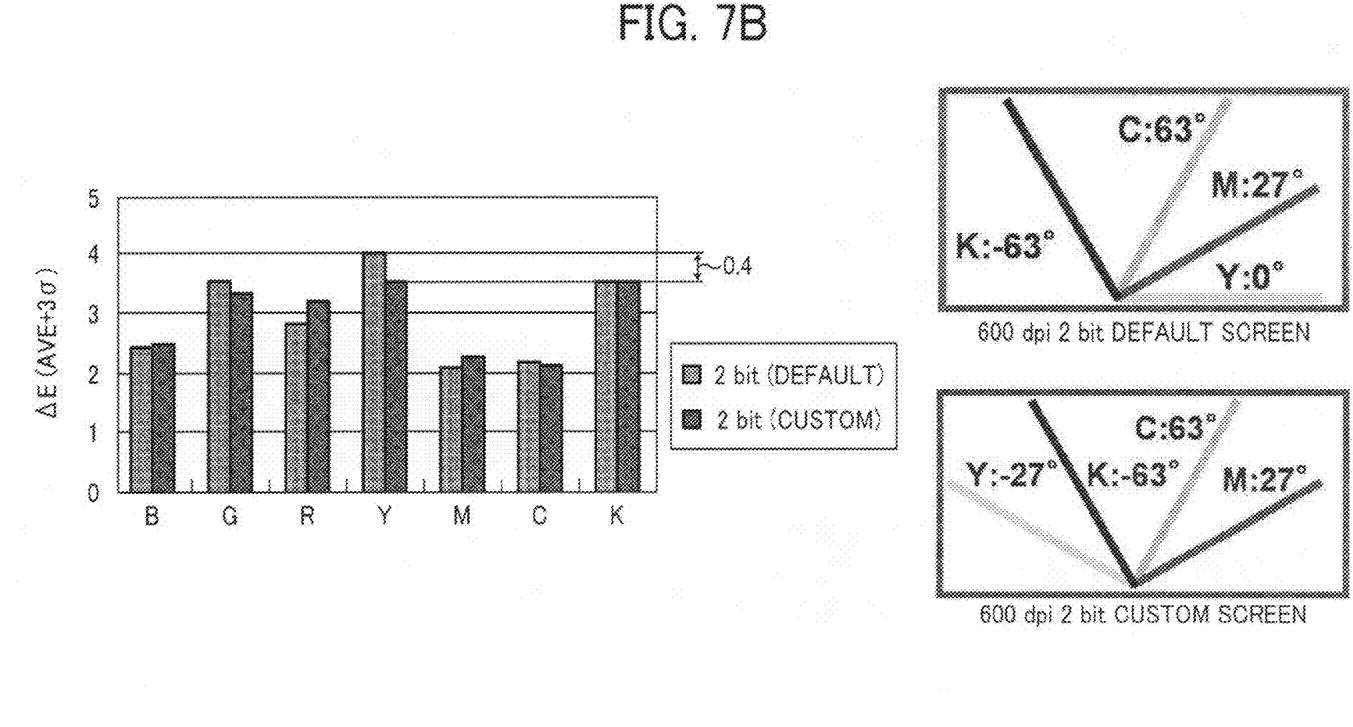
FIG. 7B illustrates improvement by the 600 dpi and 2 bit custom screen.

FIGS. 7A and 7B illustrate toner images on the 600 dpi and 2 bit default screen and the 600 dpi and 2 bit custom screen used to evaluate the present embodiment and effects thereof. It is to be noted that conditions in the evaluation are paper type: POD Gross Coat (trademark of Oji paper Co., Ltd.), image quality: 600 dpi and 2 bit output mode, evaluation item: mean difference from reference color stability within page ΔE (AVE+3σ).

FIG. 7A illustrates yellow (Y) and red (R) toner images of an input area rate of 70% respectively on the default screen and the custom screen in the output mode of 600 dpi and 2 bit. From FIG. 7A, it can be known that yellow lines on the default screen are discontinuous due to scavenging, and thus the yellow toner image is disturbed. While, fluctuations in the amount of yellow toner in red is smaller compared with yellow single color. It seems that the amount of yellow toner in red fluctuates affected by both of scavenging and reverse transfer. Fluctuations in color direction to yellow (b*) is reduced, and color fluctuations in red are smaller.

By contrast, yellow lines on the custom screen are less discontinuous since the change in screen angle can suppress the adverse effects of scavenging. Thus, the yellow toner image is less disturbed compared with the default screen. In red, however, yellow toner steadily adheres to some portions and insufficiently adheres to other portions. Thus, color fluctuations in red are recognized.

The results can be confirmed from FIG. 7B illustrating the color stability within page of the respective screens. The ordinate in FIG. 7B represents a mean value (AVE) +3σ of color differences ΔE within page from reference value.

[Default Screen]

Yellow: Color fluctuations are greater due to discontinuous lines, and accordingly ΔE (AVE+3σ) is greater.

Red: Since fluctuations in the amount of toner adhering are smaller, ΔE (AVE+3σ) is smaller.

[Custom Screen]

Yellow: Since lines are more continuous, color fluctuations are reduced, and ΔE (AVE+3σ) is smaller.

Red: Since fluctuations in the amount of yellow toner are greater, color direction to yellow is not stable, thus increasing color fluctuations and ΔE (AVE+3σ).

From the above-described evaluation, it can be known that, although yellow color fluctuations can be alleviated by changing the yellow screen angle from 0 degree toward 90 degrees, color fluctuations in red deteriorate depending on the yellow screen angle.

Additionally, it can be known from the evaluations of yellow, magenta, and red (the secondary color thereof) that there are cases where color fluctuations in the secondary color red are not alleviated (rather, worsen) even when yellow color fluctuations are reduced. In conventional knowledge, it is deemed that the secondary color fluctuations are reduced when primary color fluctuations are reduced.

Second Embodiment

Figure 8:
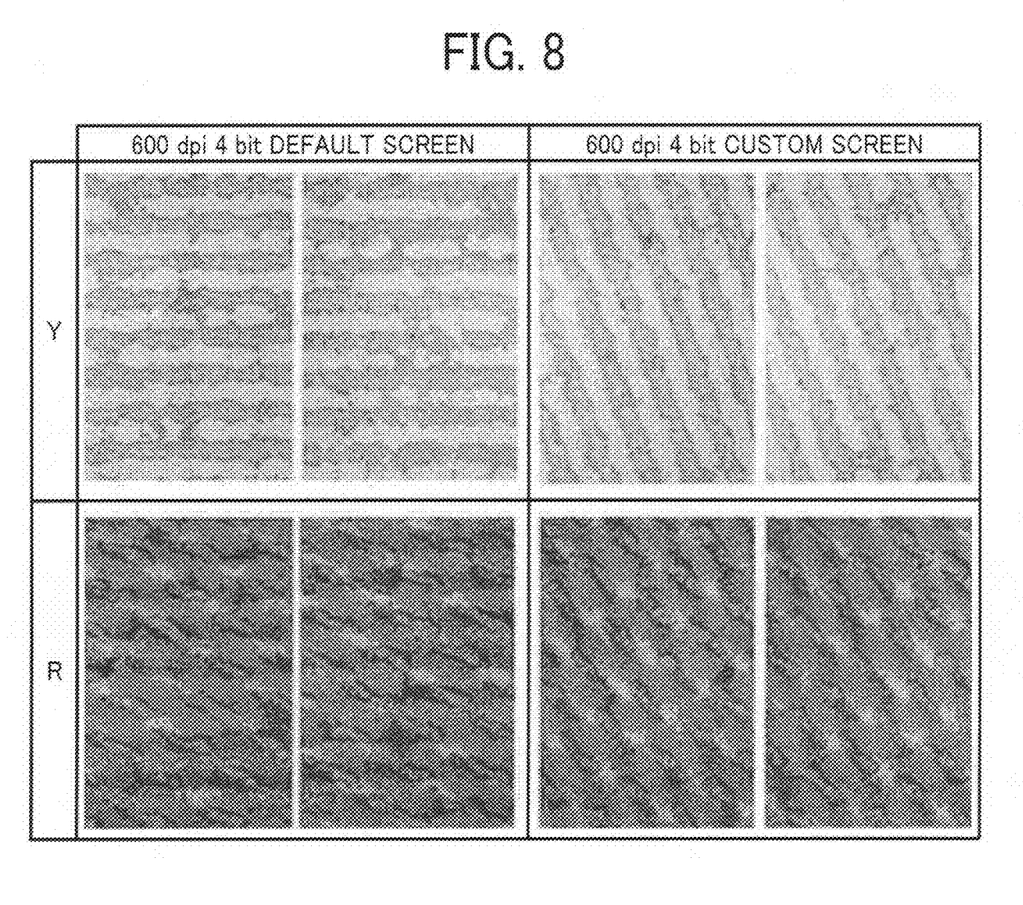
FIG. 8 illustrates toner images on the 600 dpi and 4 bit default screen and the 600 dpi and 4 bit custom screen.
Figure 9:
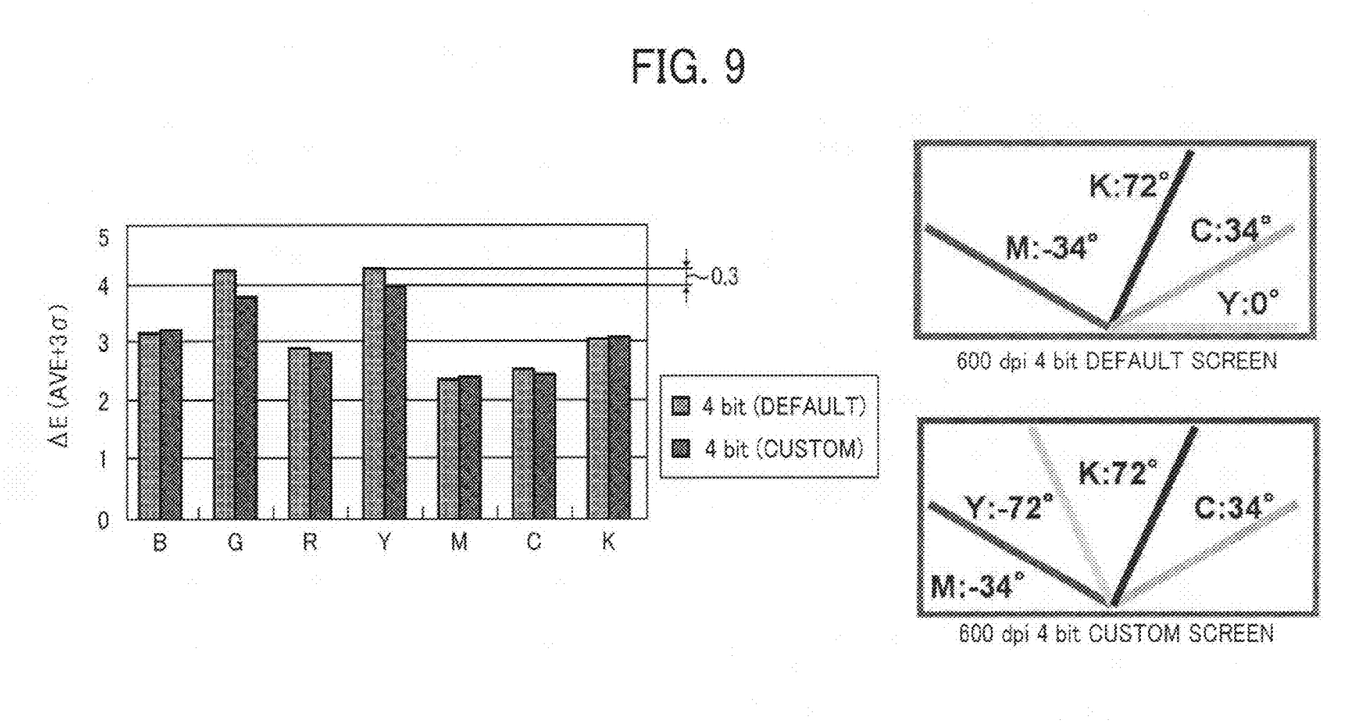
FIG. 9 illustrates improvement by the 600 dpi and 4 bit custom screen.

FIGS. 8 and 9 illustrate effects of the 600 dpi and 4 bit custom screens according to the present embodiment. FIG. 8 illustrates toner images on the 4 bit default screen and the 4 bit custom screen. FIG. 9 illustrates improvement by the 600 dpi and 4 bit custom screen.

Specifically, FIG. 8 illustrates yellow and red toner images of an input area rate of 70% respectively on the default screen and the custom screen in the output mode of 600 dpi and 4 bit. The red toner image on the custom screen is different from that in the 2 bit custom screen. In the 2 bit custom screen, the color direction to yellow of red is unstable due to fluctuations in the amount of yellow toner adhering in red, and red color fluctuations are greater. By contrast, in the 4 bit custom screen, fluctuations in the amount of yellow toner adhering are reduced, and accordingly red color fluctuations are reduced. The results can be confirmed from FIG. 9 illustrating the color stability within page of the respective screens. Similarly to FIG. 7B, the ordinate in FIG. 9 represents a mean value (AVE)+3σ of color differences ΔE within page from reference value.

[Default Screen]

Yellow: Color fluctuations are greater due to discontinuous lines, and accordingly ΔE (AVE+3σ) is greater.

Red: Since fluctuations in the amount of toner adhering are smaller, color fluctuations are smaller, and ΔE (AVE+3σ) is smaller.

[Custom Screen]

Yellow: Since lines are more continuous, yellow color fluctuations are reduced, and ΔE (AVE+3σ) is smaller.

Red: The yellow toner image is developed reliably, and the amount of yellow toner adhering in red is more stable, thus inhibiting color fluctuations and ΔE (AVE+3σ).

From the above-described verification of 2 bit and 4 bit custom screens in the output mode of 600 dpi, the following effects can be confirmed.

1. Color fluctuations in yellow and green can be alleviated by changing the yellow screen angle from 0 degree toward 90 degrees.

2. Depending on the yellow screen angle, color fluctuations in red worsen.

3. Color fluctuations in red can be suppressed when the yellow screen angle is closer to 90 degrees.

It is to be noted that, as described above, when a most stable screen angle (close to 90 degrees), among the four color screen angles, is allocated to the extreme upstream color in the direction in which the colors are superimposed, which is most susceptible to fluctuations in the amount of toner adhering at primary transfer and secondary transfer, the maximum color fluctuation in the primary color and color fluctuations in the secondary colors can be reduced.

In other words, the electrophotographic image forming apparatus 100 serving as the electrophotographic image output device according to the present embodiment employs a line screen in which, among the respective color screen angles determined by the line numbers according to the above-described requirements, a screen angle closest to 90 degrees is allocated to yellow among yellow, magenta, and cyan. Therefore, color stability can be enhanced by suppressing color fluctuations in all colors while stabilizing yellow toner images.

According to the above-described embodiment, while considering the occurrence of moire and banding, disturbance of toner images caused by scavenging can be inhibited, and color fluctuations in the respective colors can be suppressed while stabilizing yellow toner images. Thus, image formation with enhanced color stability and reduced color fluctuations can be attained.

Additionally, by using the line screen in which a screen angle closest to 90 is given to yellow out of yellow, magenta, and cyan, color fluctuations caused by discontinuous lines due to scavenging can be inhibited.

When the yellow screen angle is about 72 degree or lower, red color fluctuations worsen. Therefore, in the present embodiment, by setting the yellow screen angle to about 72 degrees or greater, yellow color fluctuations can be suppressed without worsening red color fluctuations.

Additionally, by allocating two angles closer to 90 degrees to black and yellow, color fluctuations in black, in which image disturbance is most perceivable, can be inhibited.

Additionally, regarding the other two screen angles (closer to 0 degree) than those allocated to yellow and black, the greater of the two is allocated to magenta when color fluctuations in red are greater than green. By contrast, the greater of the two is allocated to cyan when color fluctuations in green are greater than red. To inhibit the occurrence of moire, the two angles closer to 0 degree among the four screen angles are preferably allocated to magenta and cyan. At that time, similarly to yellow, the magenta and cyan screen angles are determined to inhibit effects on the secondary colors thereof, thereby inhibiting color fluctuations in all colors.

Numerous additional modifications and variations are possible in light of the above teachings. It is therefore to be understood that, within the scope of the appended claims, the disclosure of this patent specification may be practiced otherwise than as specifically described herein.

What is claimed is:

1. An electrophotographic image output device comprising:
   an image processor to receive input image data; and
   a line screen to represent halftone images and have multiple screen angles respectively allocated to different colors, the line screen satisfying requirements of:
   (A) a predetermined difference is secured between adjacent two of the multiple screen angles;
   (B) zero is not allocated to any of the multiple screen angles; and
   (C) among the multiple screen angles determined by the requirements (A) and (B), a screen angle closest to 90 degrees is allocated to yellow among yellow, magenta, and cyan, wherein:
   two of the multiple screen angles closer to 0 degree are allocated to the magenta and the cyan,
   greater of the two of the multiple screen angles is allocated to the magenta when color fluctuations in red are greater than color fluctuations in green, and
   greater of the two of the multiple screen angles is allocated to the cyan when color fluctuations in green are greater than color fluctuations in red.

2. An electrophotographic image output device comprising:
   an image processor to receive input image data; and
   a line screen to represent halftone images and have multiple screen angles respectively allocated to different colors,
   wherein,
   among yellow, magenta, and cyan, the yellow is given a screen angle closest to 90 degrees,
   two of the multiple screen angles closer to 0 degree are allocated to the magenta and the cyan,
   greater of the two of the multiple screen angles is allocated to the magenta when color fluctuations in red are greater than color fluctuations in green, and
   greater of the two of the multiple screen angles is allocated to the cyan when color fluctuations in green are greater than color fluctuations in red.

3. The electrophotographic image output device according to claim 2, wherein a screen angle of 72 degrees or greater is allocated to the yellow.

4. The electrophotographic image output device according to claim 2, wherein two of the multiple screen angles closer to 90 degrees are allocated to black and the yellow.

* * * * *